United States Patent [19]

Kitagawa et al.

[11] Patent Number: 4,728,188
[45] Date of Patent: Mar. 1, 1988

[54] LIGHT SOURCE DEGERADATION DETECTING APPARATUS FOR LASER DEVICE

[75] Inventors: Seizi Kitagawa, Ina; Shozi Yoshikawa; Haruhiko Takemura, both of Tokyo, all of Japan

[73] Assignee: Olympus Optical Co., Ltd., Tokyo, Japan

[21] Appl. No.: 839,334

[22] Filed: Mar. 13, 1986

[30] Foreign Application Priority Data

Mar. 20, 1985 [JP] Japan .................................. 60-56891

[51] Int. Cl.$^4$ .............................................. G01J 1/18
[52] U.S. Cl. ................................ 356/218; 324/158 D; 356/121
[58] Field of Search .................. 356/121, 218; 372/29, 372/38; 369/54, 116; 324/158 D

[56] References Cited

U.S. PATENT DOCUMENTS 4,344,173  8/1982  Straus ..................................... 372/38
4,489,477 12/1984  Chik et al. .................. 324/158 D X

FOREIGN PATENT DOCUMENTS 0061034A  9/1982  European Pat. Off. .
0096341A 12/1983  European Pat. Off. .

Primary Examiner—Vincent P. McGraw
Attorney, Agent, or Firm—Frishauf, Holtz, Goodman & Woodward

[57] ABSTRACT

A light source degradation detecting apparatus for a laser device monitors drive currents and output laser beams. The degradation detecting apparatus includes drivers for supplying three drive signals to the laser, a photodiode for detecting laser outputs produced in response to the drive signals, a memory for storing measured values and the drive signals, and a discriminator for calculating ratio P from storage data (laser outputs $W_n$, $W_{n+1}$, and $W_{n+2}$ produced in response to drive currents $I_n$, $I_{n+1}$, and $I_{n+2}$) as follows:

$$P=\{(W_{n+2}-W_n)/(I_{n+2}-I_n)\}/\{(W_{n+1}-W_n)/(I_{n+1}-I_n)\}$$

and for discriminating that the laser has reached an end of its life when the ratio P falls outside a predetermined range.

5 Claims, 7 Drawing Figures

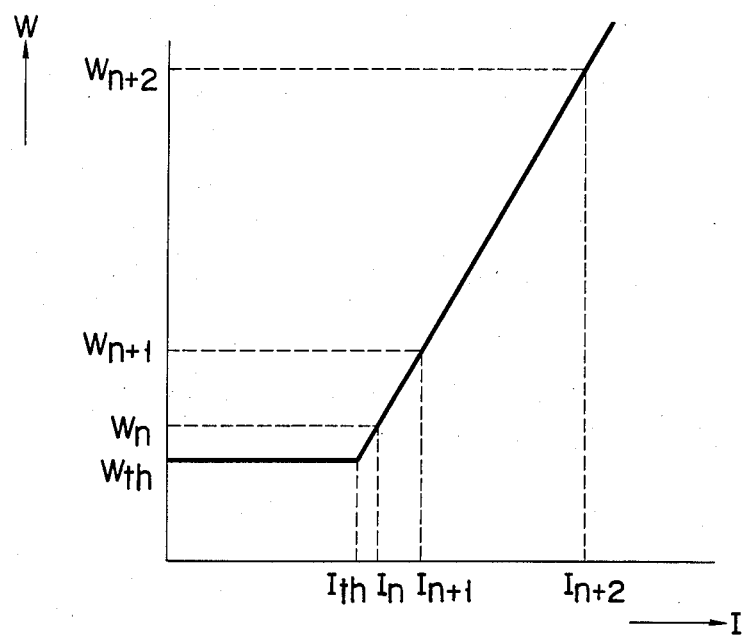
F I G. 1
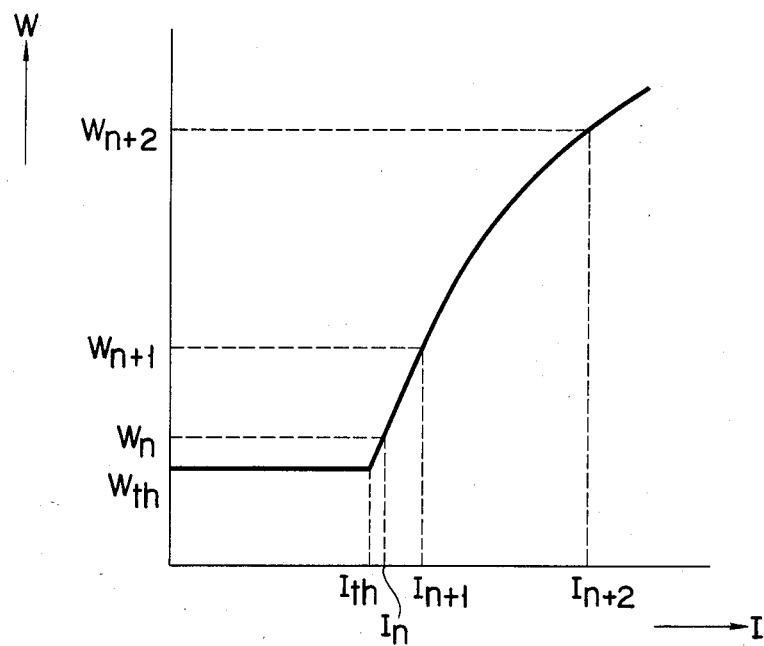
F I G. 2

LIGHT SOURCE DEGERADATION DETECTING APPARATUS FOR LASER DEVICE

BACKGROUND OF THE INVENTION

The present invention relates to a laser device and, more particularly, to a light source degradation detecting apparatus.

Various types of optical data processing apparatuses such as optical data recording/reproducing systems (so-called optical disk systems), laser printers, and optical communications systems have been commercially available in recent years. Laser sources for these systems must generate stable laser outputs. For this reason, automatic power control (APC) circuits as optical output stabilizing means are built into conventional semiconductor laser devices. Such an APC circuit feeds back a drive current to a corresponding laser source to stabilize the laser output.

However, the conventional APC circuits cannot compensate for characteristic degradation that depends on the life of a semiconductor laser. In a conventional laser device, if a predetermined laser output cannot be at a predetermined drive current, the semiconductor laser must be regarded as having reached the end of its life.

In addition, in discriminating such characteristic degradation by monitoring the drive current, a reference current and a reference light intensity must be adjusted for each semiconductor laser since the output characteristics of different semiconductor lasers are inherently different, thus resulting in an inconvenient and timeconsuming operation.

Typical recent problems in semiconductor laser life discrimination are a local change in linearity of quantization efficiency (i.e. drive current vs laser output) and an inclination of a linear gradient. The local change and the inclination cannot be detected by monitoring laser outputs generated in response to a single drive current.

SUMMARY OF THE INVENTION

It is an object of the present invention to provide a light source degradation detecting apparatus wherein a specific degradation and life of a laser can be properly detected and at the same time, a slight change in linearity of quantization efficiency can be detected.

In order to achieve the above object of the present invention, there is provided a light source degradation detecting apparatus for a laser device, comprising a driver for supplying a plurality of drive signals to a laser, a detector for measuring laser outputs respectively generated in response to the drive signals, and a discriminator for discriminating laser characteristic degradation on the basis of measurement results of the detector.

BRIEF DESCRIPTION OF THE DRAWINGS

FIG. 1 is a graph for explaining a first principle for discriminating characteristic degradation of a laser device according to the present invention;

FIG. 2 is a graph showing the degraded characteristics of the laser device;

DETAILED DESCRIPTION OF THE PREFERRED EMBODIMENTS

A light source degradation detecting apparatus according to an embodiment of the present invention will be described with reference to the accompanying drawings.

The relationship between drive current I and laser output W in a normal semiconductor laser is shown in FIG. 1. Laser outputs $W_n$, $W_{n+1}$, and $W_{n+2}$ in response to drive current $I_n$, $I_{n+1}$, and $I_{n+2}$ are measured, and ratio P defined below is calculated. Therefore, degradation of laser characteristics (i.e., linearity of quantization efficiency) and life can be discriminated on the basis of ratio P:

$$\{(W_{n+2} - W_n)/(I_{n+2} - I_n)\} \quad (1)$$
$$/\{(W_{n+1} - W_n)/(I_{n+1} - I_n)\}$$
$$= R_{n+1}/R_n$$
$$= P$$

A given range is set for ratio P, and its upper and lower limits are defined as $P_{UL}$ and $P_{LL}$, respectively. If ratio P satisfies the following inequality, the laser has not reached the end of its life (otherwise, the laser has reached its end):

$$P_{LL} < P < P_{UL} \quad (2)$$

If ratio P does not satisfy inequality (2), quantization efficiency of the semiconductor laser is degraded, as is seen from its output shown in FIG. 2, thereby indicating that the laser has reached the end of its life.

Figure 3:
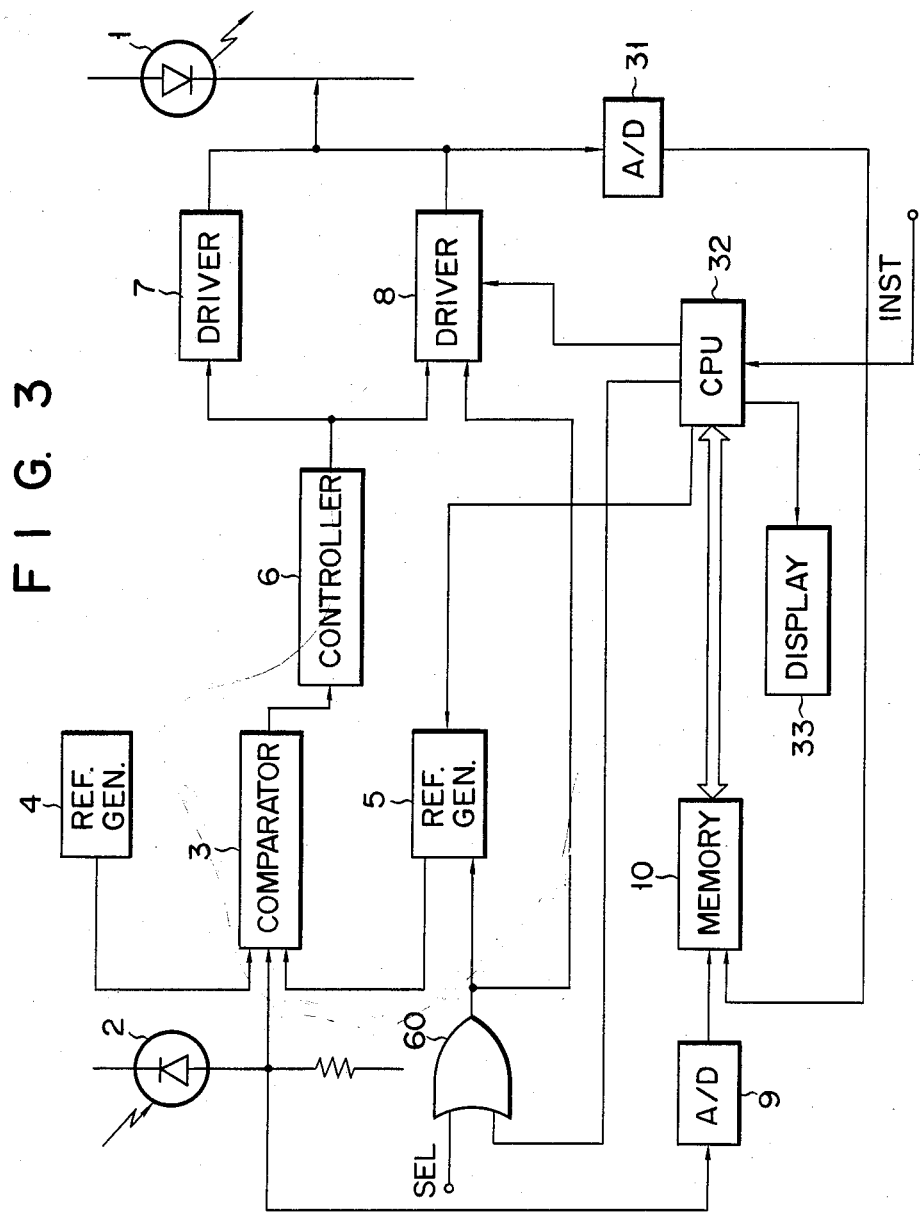
FIG. 3 is a block diagram of a light source degradation detecting apparatus employing the first principle according to a first embodiment of the present invention.

FIG. 3 is a block diagram of a first embodiment employing the above principle. This embodiment exemplifies a laser life discriminator applied to an optical disk system. An output beam from semiconductor laser (e.g., a laser diode) 1 is detected by photodetector (e.g., a PIN diode) 2. An output from photodetector 2 is compared by comparator 3 with at least one of the reference voltages generated by reference generators 4 and 5. The reference voltages from generators 4 and 5 have reference levels corresponding to a read laser beam level (i.e., a low intensity) and a write laser beam level (i.e., a high intensity), respectively. An output from comparator 3 is supplied to controller 6. Controller 6 generates various control signals in response to outputs from comparator 3. An output from controller 6 is supplied to drivers 7 and 8 for driving laser 1 with high and low intensities. In this embodiment, only driver 7 is operated to generate a laser beam of low intensity. However, both drivers 7 and 8 are simultaneously operated to generate a laser beam of high intensity.

A selection signal (SEL) for selecting a high or low intensity output from the laser source is supplied to high-intensity reference generator 5 and high-intensity driver 8. Generator 5 and driver 8 are operated only in the high-intensity state. An output from photodetector 2 is converted by A/D converter 9 into a digital signal, which is then stored in memory 10. Outputs from drivers 7 and 8 are converted by A/D converter 31 to digital signals, which are also stored in memory 10. Upon reception of discrimination instruction signal (INST), CPU 32 calculates both storage data signals (a drive current value and a laser output) in accordance with equation (1), and discriminates the calculation results according to inequality (2). The disrimination results are then displayed on display 33. In this way, the degradation of quantization efficiency can be detected, and the life of the laser can be discriminated. It should be noted that the output intensity of the laser source need not be selected in response to external selection signal SEL, but can be selected by CPU 32. In this case, a signal from CPU 32 is supplied together with signal SEL to OR gate 60, and an output from gate 60 is supplied to generator 5 and driver 8.

Figure 4:
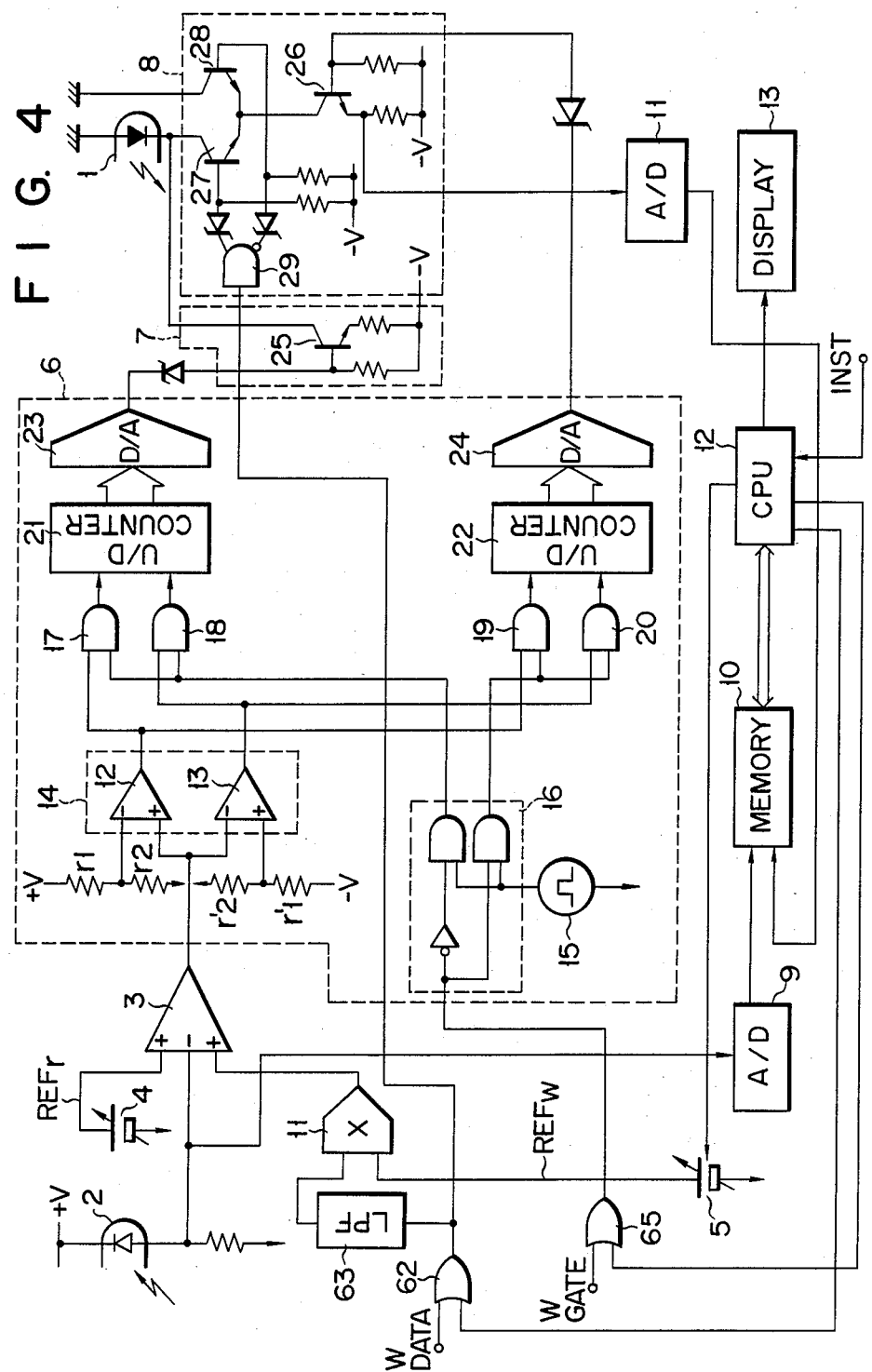
FIG. 4 is a circuit diagram showing a detailed arrangement of the first embodiment.

FIG. 4 is a circuit diagram showing a detailed arrangement of the first embodiment. Photodiode 2 is fabricated together with laser 1. An output beam from the rear surface of laser 1 is photoelectrically converted to produce a voltage signal. An optical disk is irradiated with an output beam from the front surface of laser 1 to perform write/read operations. An intensity of the output beam from the rear surface of laser 1 is proportional to that from the front surface thereof, so that the output beam from the rear surface can be regarded as consistent with that from the front surface. However, for more accurate measurment, a half mirror or the like can be inserted in an optical path of the output beam from the front surface of laser 1 to emit some of rays of the write/read beam onto photodiode 2.

Differential amplifier 3 has one inverting input terminal and two noninverting input terminals. The output voltage from photodiode 2 is supplied to the inverting input terminal of amplifier 3. Read reference voltage REFr from power source 4 is supplied to the first noninverting input terminal of amplifier 3.

An external selection signal (write data W DATA) for selecting a high or low level laser output and a selection signal from CPU 32 are supplied to low-pass filter 63 through OR gate 62. Write reference voltage REFw (higher than read reference voltage REFr) from variable power source 5 and an output from low-pass filter 63 are supplied to the second noninverting input terminal of amplifier 3 through multiplier 11. For this reason, when write data W DATA is set at high level, voltage REFw is supplied to amplifier 3. Voltage REFw can be varied in response to the control signal from CPU 32.

Amplifier 3 generates an output signal, corresponding to a difference between the inverting input signal and a sum of the first and second noninverting input signals.

An output from amplifier 3 is supplied to window comparator 14 in controller circuit 6. Comparator 14 has comparators 12 and 13. The output from amplifier 3 is supplied to the noninverting input terminal of comparator 12 and to the inverting input terminal of comparator 13. A positive reference voltage obtained by dividing positive voltage $+V$ by resistors r1 and r2 is supplied to the inverting input terminal of comparator 12. A negative reference voltage obtained by dividing negative voltage $-V$ by resistors r1' and r2' is applied to the noninverting input terminal of comparator 13.

An output signal from comparator 12 is supplied to first input terminals of AND gates 17 and 19. An output signal from comparator 13 is supplied to the first input terminals of AND gates 18 and 20. Clock pulses from clock pulse generator 15 are supplied to the second input terminals of gates 17 and 18 through the first output terminal of gate circuit 16. The clock pulses from generator 15 are also supplied to the second input terminals of AND gates 19 and 20 through the second output terminal of circuit 16. Circuit 16 generates the clock pulses from one of its output terminals in response to an output from OR gate 65. Gate 65 receives an external mode signal (write gate signal W GATE in this embodiment) and the mode signal from CPU 32. Write gate signal W GATE is set at high level in the write mode, and at low level in the read mode.

Outputs from gates 17 and 18 are then supplied to up- and down-count terminals of up/down counter 21. Outputs from gates 19 and 20 are supplied to up- and down-count terminals of up/down counter 22.

Outputs from up/down counters 21 and 22 are supplied to D/A converters 23 and 24, respectively.

The output terminals of converters 23 and 24 are connected to read driver 7 and write driver 8, respectively. An output signal from converter 23 is supplied to the base of drive transistor 25 in driver 7 through a Zener diode. A collector current of transistor 25 is supplied to laser 1. The output signal from converter 24 is supplied to the base of drive transistor 26 of driver 8 through a Zener diode. A collector current of transistor 26 is supplied to laser 1 through a pair of transistors 27 and 28. The ON/OFF operation of transistors 27 and 28 is controlled in response to an output of "1"/"0" from OR gate 62 through gate 29. When transistor 27 is turned on and transistor 28 is turned off, a sum of the drive currents from drivers 7 and 8 is supplied to laser 1. When transistor 27 is turned off and transistor 28 is turned on, only the drive current from driver 7 is supplied to laser 1. It is possible to generate the write laser beam in response to only the drive current from high intensity driver 8.

With this arrangement, when write data W DATA is set at high level, transistor 27 is turned on through gates 62 and 29, and laser 1 emits a laser beam of high intensity. The high intensity laser beam is detected by photodiode 2, and counter 21 is started in response to the output from photodiode 2 through amplifier 3, comparator 14, and gate 17. Counter 21 continues a countup operation until the actual laser intensity reaches a predetermined level. The count of counter 21 is supplied to driver 7 through converter 23. Thereafter, when the detection signal from photodiode 2 exceeds a reference voltage (REFr+REFw) level, a clock pulse is supplied from the output of gate 18 to the down-count terminal of counter 21. Counter 21 then performs a count-down operation for a short period of time, and the laser intensity is stabilized at the predetermined level.

In this embodiment, characteristic degradation detection is performed in the write mode. Upon reception of discrimination instruction signal (INST), CPU 32 varies the voltage from source 5 to change the write reference voltage REFw. Since the optical disk is normally rotated at a predetermined angular velocity, a linear velocity of an outer track with respect to the laser beam is higher than that of an inner track. The intensity of the laser beam per unit area at the outer track is lower than that at the inner track. This does not greatly influence the read level. However, the decrease in intensity of the laser beam at outer tracks cannot be neglected in the write level. In order to obtain a uniform laser beam intensity per unit area independent of track position, the laser output in the write mode must be increased for outer tracks. The drive currents $I_1$ and $I_4$ correspond to the minimum and maximum levels of write laser beam. The drive current from driver 8 and the laser output from photodiode 2 are stored in memory 10 through converters 9 and 11. CPU 12 calculates the ratio of drive current to laser output according to equation (1) and performs discrimination according to inequality (2). The discrimination result is then displayed on display 13. Life discrimination is performed such that the head is moved to an innermost position on the optical disk and a region excluding the data recording area is irradiated with a laser beam held in a defocused state.

Further, a read gate signal for controlling the emission of the read laser beam may be introduced in addition to the write gate signal W GATE.

Figure 5:
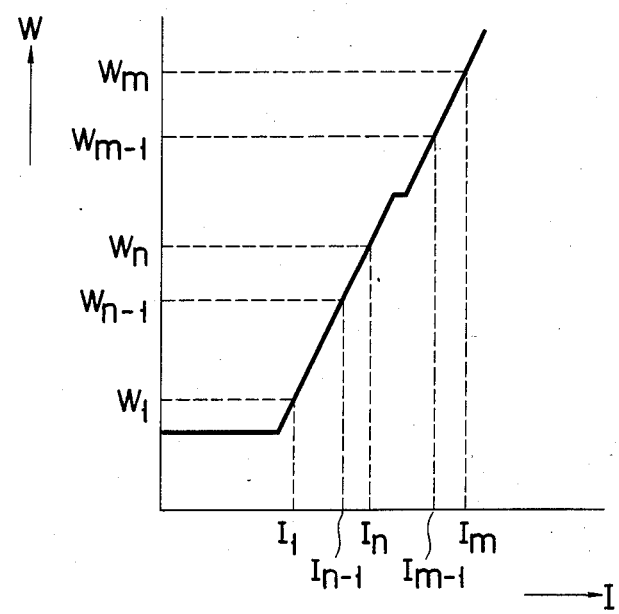
FIG. 5 is a graph for explaining a principle of light source degradation detection according to a second embodiment of the present invention.

FIG. 5 shows the principle of life discrimination according to a second embodiment of the present invention. In the second embodiment, three or more measuring points for drive current I are prepared. In this case, if all ratios $P_i$ satisfy inequality (2), CPU 32 determines that the semiconductor laser has not reached the end of its life:

$$\{(W_{i+2} - W_i)/(I_{i+2} - I_i)\} \quad (3)$$
$$/\{(W_{i+1} - W_i)/(I_{i+1} - I_i)\}$$
$$= R_{i+1}/R_i$$
$$= P_i \, (i = 1 \text{ to } m - 2)$$

This embodiment requires a larger number of sampling operations and therefore requires a longer sampling time. However, this embodiment has an advantage in that local changes in quantization efficiency, as shown in FIG. 5, can be properly detected.

Figure 6:
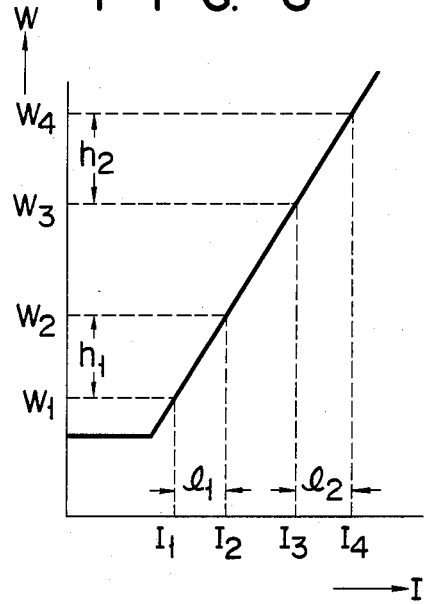
FIG. 6 is a graph for explaining a principle of light source degradation detection according to a third embodiment of the present invention.
Figure 7:
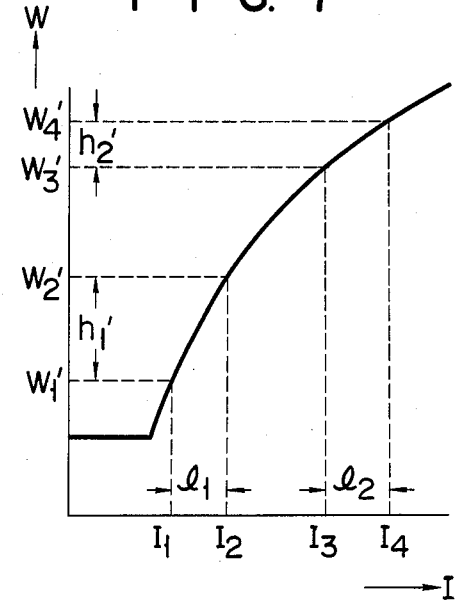
FIG. 7 is a graph showing the degraded characteristics of a laser device according to the third embodiment.

FIG. 6 shows the principle of life discrimination according to a third embodiment of the present invention. In this embodiment, one measurement is performed at the time of shipment or initialization of the apparatus. Thereafter, measurements are periodically performed during the use of the apparatus to differentiate the degree of variation over time. More specifically, at the time of shipment, as shown in FIG. 6, laser outputs $W_1$, $W_2$, $W_3$, and $W_4$ in response to drive currents $I_1$, $I_2$, $I_3$, and $I_4$ ($I_2-I_1=l_1$ and $I_4-I_3=l_2$) are measured, and ratio $P_1=(h_2/l_2)/(h_1/l_1)$ (for $W_2-W_1=h_1$ and $W_4-W_3=h_2$) is calculated. The laser outputs and the ratio are stored in a ROM of memory 10. During actual use of the apparatus, as shown in FIG. 7, laser outputs $W_1'$, $W_2'$, $W_3'$, and $W_4'$ in reponse to drive currents $I_1$, $I_2$, $I_3$, and $I_4$ are measured, and ratio $P_2=(h_2'/l_2)/(h_1''/l_1)$ (for $W_2'-W_1'=h_1'$ and $W_4'-W_3'=h_2'$) is calculated. The resultant laser outputs and ratio are stored in the RAM. If these do not satisfy the following condition, CPU 32 determines that the semiconductor laser has not reached the end of its life:

$$D=|(P_2-P_1)/P_1|\leq K \quad (4)$$

where K is any positive integer, and D represents the degree of changes in quantization efficiency. Thus, according to the third embodiment, the time variation of quantization efficiency can be detected, thereby discriminating the life of the laser. In order to simplify the calculation, $l_1=l_2$ is given.

According to the present invention as described above, laser outputs in response to drive currents at a plurality of points are measured, and values representing quantization efficiency are calculated by the measurement results. Therefore, characteristic degradation of a laser can be properly discriminated.

The present invention is not limited to the particular embodiments described above. Various changes and modifications may be made within the spirit and scope of the invention. For example, controller 6 in FIG. 4 can be substituted by an analog control circuit such as a PID controller using operational amplifiers and integrators.

What is claimed is:

2. An apparatus according to claim 1, in which said measuring means measures laser output signals current $W_n$, $W_{n+1}$, and $W_{n+2}$ produced in response to drive signal $I_n$, $I_{n+1}$, and $I_{n+2}$, respectively, and said second calculating means calculates ratio P according to the measurement results:

$$P=\{(W_{n+2}-W_n)/(I_{n+2}-I_n)\}/\{(W_{n+1}-W_n)/(I_{n+1}-I_n)\}$$

and said third means determines that the laser device has reached an end of its life when the ratio P falls outside a predetermined range.

3. An apparatus according to claim 2, in which said measuring means measures laser output signals $W_i$ produced in response to drive signals current $I_i$ ($i=1$ to $m-2$), respectively, and said second calculating means calculates ratio $P_i$ on the basis of measurement results:

$$P_i=\{(W_{i+2}-W_i)/(I_{i+2}-I_i)\}/\{(W_{i+1}-W_i)/(I_{i+1}-I_i)\}$$

and said third means determines that the laser device has reached an end of its life when the ratio $P_i$ falls outside a predetermined range.

4. An apparatus according to claim 1, in which said measuring means measures laser output signals produced in response to the drive signals at first and second times, and said third means determines that the laser device has reached an end of its life when a difference between measurement results at the first and second times falls outside a predetermined range.

5. An apparatus according to claim 4, in which said measuring means measures laser output signals $W_1$, $W_2$, $W_3$, and $W_4$ produced in response to drive signals $I_1$, $I_2$, $I_3$, and $I_4$ (for $I_2-I_1=l_1$, and $I_4-I_3=l_2$), respectively, at the first time and laser outputs $W_1'$, $W_2'$, $W_3'$, and $W_4'$ produced in response to the drive signals $I_1$, $I_2$, $I_3$, and $I_4$, respectively, at the second time, and said second calculating means calculates ratio $P_1=(h_2/l_2)/(h_1/l_1)$ (for $W_2-W_1=h_1$, and $W_4-W_3=h_2$) on the basis of measurement results from the first time and ratio $P_2=(h_2'/l_2)/(h_1'/l_1)$ (for $W_2'-W_1'=h_1'$, and $W_4'-W_3'=h_2'$), and that the laser device has reached an end of its life when a ratio $(P_2-P_1)/P_1$ falls outside a predetemined range.

1. A light source degraduation detecting apparatus for a laser device, comprising:
means for supplying a plurality of drive signals of a plurality of different levels to the laser device;

means for measuring respective output signals which the laser device produces in response to the drive signals;

first calculating means for calculating efficiencies of the laser device, each of the efficiencies being a ratio of a difference in level between two of the plurality of drive signals to a difference between levels of two corresponding output signals of the laser device;

second calculating means coupled to the first calculating means for calculating a ratio of the efficiencies; and third means coupled to the second calculating means for determining the life of the laser device based on said ratio.

* * * * *